United States Patent
Poujois

[11] 3,982,196
[45] Sept. 21, 1976

[54] DIFFERENTIAL VOLTAGE AMPLIFIER
[75] Inventor: Robert Poujois, Grenoble, France
[73] Assignee: Commissariat a l'Energie Atomique, Grenoble, France
[22] Filed: Feb. 28, 1975
[21] Appl. No.: 553,996

[30] Foreign Application Priority Data
Mar. 1, 1974   France .............................. 74.07078

[52] U.S. Cl. .................................... 330/9; 307/272; 330/10; 330/51; 330/69; 330/84; 340/347 NT
[51] Int. Cl.² .......................................... H03F 3/45
[58] Field of Search ............... 330/9, 10, 51, 69, 84; 307/272, 276; 340/347 NT

[56]         References Cited
            UNITED STATES PATENTS
3,859,654   1/1975   Harrison et al. ............... 340/347 NT

*Primary Examiner*—James B. Mullins
*Attorney, Agent, or Firm*—Lane, Aitken, Dunner & Ziems

[57]            ABSTRACT

A differential voltage amplifier having high gain and a wide bandwidth essentially comprises an unstable circuit having one position of unstable equilibrium and two distinct positions of equilibrium which can be maintained for a given period of time, an input stage for applying signals to the input of said unstable circuit for a given period of time, means for returning the unstable circuit to its position of unstable equilibrium, means for calibrating the output of the unstable circuit at the voltage $+V_m$ or at the voltage $-V_m$ according to the position of unstable equilibrium, means for integrating the calibrated signal which appears at the output of the bistable circuit for a given period of time and a clock for the synchronization of the entire circuit.

12 Claims, 16 Drawing Figures

DIFFERENTIAL VOLTAGE AMPLIFIER

This invention relates to a differential voltage amplifier which makes use of a bistable circuit or more generally an unstable circuit.

In more exact terms, the present invention is concerned with the construction of an amplifier circuit which has a low input level and is readily applicable to integrated circuits while permitting a high gain and a wide pass-band.

Since the following description of the invention makes frequent reference to the bistable circuit concept, it should be explained that this term is understood to mean a circuit which has two stable states and one unstable state. A device is added for maintaining the bistable circuit in its unstable state as long as the device is active. This device will be generally designated as an inhibition device. When no input signal is applied, the bistable circuit which is maintained in its unstable state remains in this state. On the contrary, a signal applied to the input of said circuit results in unbalance of said circuit towards one of these two stable states. Said stable states are preferably symmetrical with respect to the unstable state.

There are many applications in which it is necessary to have an amplifier circuit which provides a high gain for an input signal having a very low level. It is also necessary in the majority of instances to ensure that this amplifier has a very broad pass-band.

Amplifier circuits for amplifying very-low-level input signals are already in existence, one noteworthy example being the chopper amplifiers. It is known that, in amplifiers of this type, the direct-current voltage to be amplified is converted into an alternating-current voltage by chopping or periodic modulation of the voltage at any selected frequency. The chopper or device for modulating the direct-current voltage is usually a diode or a transistor. Amplifiers of this type suffer from a disadvantage in that their cost is about ten times higher for equal performances than the cost of the amplifier in accordance with the invention. Moreover, the amplifiers of the prior art have a narrower pass-band on account of the large number of stages which are necessary (more than 6) in order to obtain a high gain.

The present invention is precisely directed to an amplifier which makes use of an unstable circuit and overcomes the disadvantages mentioned in the foregoing.

The amplifier essentially comprises:

an unstable circuit having one position of unstable equilibrium and two distinct positions of equilibrium which can be maintained for a certain period of time, an input stage which is capable of applying signals to the input of said unstable circuit for a given period of time, means for returning said unstable circuit to its position of unstable equilibrium, means for calibrating the output of said circuit at the voltage $+V_m$ or at the voltage $-V_m$ according to said position, means for integrating the calibrated signal which appears at the output of said unstable circuit for a given period of time, and a clock for the synchronization of the entire circuit.

The unstable circuit is preferably a bistable circuit and comprises two complementary outputs; said circuit is constituted by two identical amplifiers mounted with negative feedback to each other.

In accordance with a further characteristic feature, the calibrating means are constituted by two voltage sources respectively equal to $+V_m$ and $-V_m$, said voltage sources being each connected to a common output conductor through a switch controlled by the state or the corresponding output of the bistable circuit.

In accordance with a second characteristic feature, the integrating means are constituted by two capacitors mounted in parallel between said common output lead and ground, said common lead being provided with a switch placed between said two capacitors.

In a preferred embodiment which makes it possible to compensate for the offset voltage, the input stage comprises one connection to ground through a switch in the case of each input and the amplifier comprises a second assembly of integrating means mounted in parallel with the first means and having an output connected in a feedback loop to one of the two inputs of the bistable circuit.

A more complete understanding of the invention will in any case be obtained from the following description in which a number of embodiments of the invention are given by way of example without any limitation being implied, reference being made to the accompanying figures, wherein.

Figure 1:
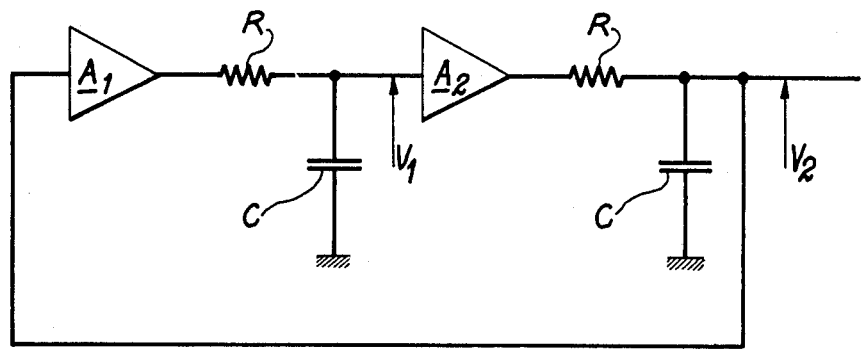
FIG. 1 is a schematic diagram of a bistable circuit having one position of unstable equilibrium.

There is shown in FIG. 1 one form of construction of bistable circuits having one unstable state and two stable states. The circuit is constituted by two identical amplifying stages $A_1$ and $A_2$ which are mounted with total feedback, that is to say in which the output of each amplifier is fed back to the input of the other amplifier.

The frequency limitation of each amplifying stage is represented in the figure by the resistors R and the capacitors C. The voltages $V_2$ and $V_1$ are applied respectively to the inputs of the amplifiers $A_1$ and $A_2$. There is an unstable equilibrium if $V_1$ and $V_2$ are zero and the relation $A_2 \times V_2 = V_2$ is thus verified (where $A$ represents the common gain of the amplifiers). It will be demonstrated that, on the contrary, if the voltages are not zero or identical, the circuit changes over towards one of its two positions of stable equilibrium. The circuit is defined by the two following differential equations:

$$RC \frac{dV_2}{dt} = A V_1 - V_2$$

$$RC \frac{dV_1}{dt} = A V_2 - V_1,$$

If $\tau$ designates the time constant of each amplifier, and which is equal to $RC$, the expression giving the value of $V_1$ is as follows:

$$V_1 = C_1 e^{-(A+1)\frac{t}{\tau}} + C_2 e^{(A-1)\frac{t}{\tau}}$$

where $C_1$ and $C_2$ represent the two integration constants.

Postulating that the unbalance is produced by a fixed voltage $V_0$, we have as an initial condition $V_1 = V_0$ and $dV_1/dt = 0$. We deduce therefrom the values of the constants $C_1$ and $C_2$ and the overall solution of the system is as follows:

$$V_1 = V_0 \frac{A-1}{2A} e^{-(A+1)\frac{t}{\tau}} + V_0 \frac{(A+1)}{2A} e^{(A-1)\frac{t}{\tau}}$$

The circuit will move no longer when the voltage $V_1$ finally attains the saturation voltage $\pm V_M$ of the amplifier. If $V_1 = -V_0$ had been adopted as an initial condition, the system would have changed over towards the value $-V_M$. This accordingly demonstrates the possibility of initiating changeover of a circuit by means of a low voltage $V_0$, the changeover being a function of the sign of $V_0$. In the particular case of the figure, the voltage $V_0$ represents the initial charge of one of the capacitors of the unstable circuit.

Figure 2:
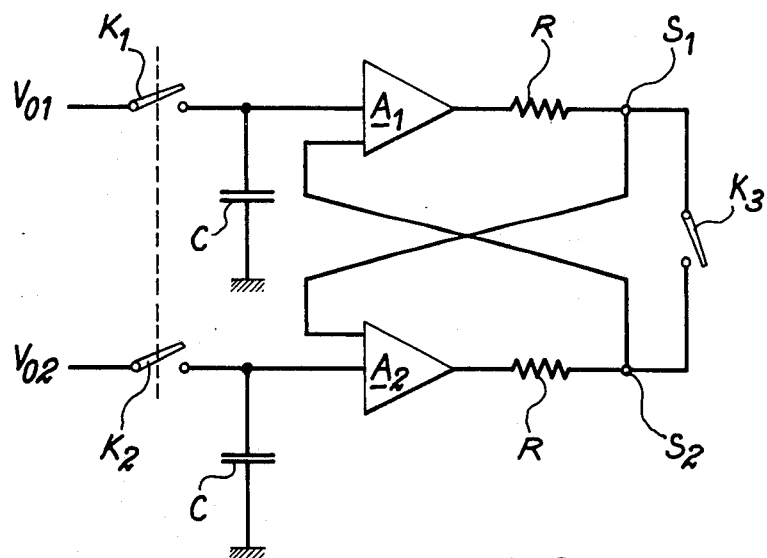
FIG. 2 is a wiring diagram of the bistable circuit of FIG. 1 with a differential input.

There is shown in FIG. 2 one form of construction of the above-mentioned bistable circuit which is mounted as a differential circuit. There are again shown in this figure the two identical amplifiers $A_1$ and $A_2$ which are mounted with total feedback to each other, the frequency limitation of the amplifiers being represented by the capacitors C and resistors R. The differential inputs are provided respectively with switches $K_1$ and $K_2$ for applying the signal to the bistable circuit in a differential form. A similar calculation to the one previously made would show that, if the two capacitors were charged at opposite voltages $-V_0$ and $+V_0$, the circuit would remain in unstable equilibrium. In the case of the bistable circuits commonly employed, the amplifiers in fact have negative gains $-A$ and the circuit accordingly remains in unstable equilibrium in respect of identical voltages in the capacitors. In this case, it is the differential signal $V_0 = V_{01} - V_{02}$ ($V_{01}$ and $V_{02}$ being respectively applied to the differential inputs of the bistable circuit) which initiates the unbalance of the circuit towards one of its two stable positions. By closing the switches $K_1$ and $K_2$, the capacitors C are pre-charged to values corresponding to the voltages $V_{01}$ and $V_{02}$. As soon as the switches are re-opened, the circuit changes over to a position of stable equilibrium which depends on the sign of the difference between the voltages contained in the capacitors of the circuit. Depending on the sign of the signal $V_0$, that is to say depending on the relative values of $V_{01}$ and of $V_{02}$, the circuit changes over towards the values $-V_M$ or $+V_M$ of saturation. In order to maintain the bistable circuit in its position of unstable equilibrium, or in order to return said circuit in this position, the simplest solution consists in connecting the outputs $S_1$ and $S_2$ of the amplifiers by means of a switch $K_3$. This operation will be designated hereinafter as the inhibition control.

Two supplementary inputs are added in order to make it possible to change the capacitors C during the inhibition and thus to provide two high-impedance inputs.

Figure 3:
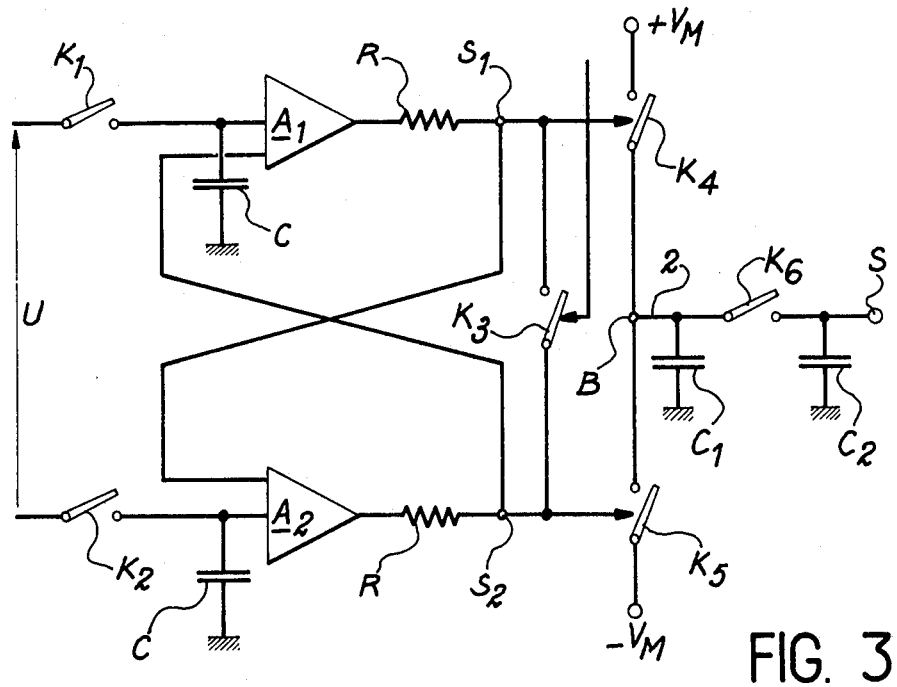
FIG. 3 is a wiring diagram of an amplifier in accordance with the invention.

There is shown in FIG. 3 one form of construction of the amplifier in accordance with the invention by means of the bistable circuit described in the foregoing. There are again shown the amplifiers $A_1$ and $A_2$ which are mounted to provide total negative feedback with their circuits corresponding to the R and C frequency limitation. There are also shown the switches $K_1$ and $K_2$ for the introduction of the differential voltage and the inhibition switch $K_3$. The outputs of the amplifiers $A_1$ and $A_2$ control switches $K_4$ and $K_5$ respectively. These switches $K_4$ and $K_5$ are capable of establishing a connection between the voltage sources $+V_M$ and $-V_M$ and a common output lead 2. Two capacitors designated respectively by the references $C_1$ and $C_2$ are mounted in parallel between the common output lead 2 and ground. A switch $K_6$ is connected to the common output lead 2 between the two capacitors $C_1$ and $C_2$. The output S of the device is located on the other side of the capacitor $C_2$.

It will become apparent hereinafter that the circuit shown in FIG. 3 constitutes an amplifier. The bistable circuit provides information on the all-or-none principle. Provided that a mean value of the output information is obtained by causing the circuit described in FIG. 3 to change state $n$ times per second under the influence of the input signal, a proportional amplifier is obtained between two reversals of state and the circuit is restored to its position of unstable equilibrium by the inhibition control. The voltage sources $+V_M$ and $-V_M$ are intended to make up for the fact that the output of a single amplifying stage (amplifier $A_1$ or $A_2$) does not vary within well-defined limits and thus to provide at both outputs of the bistable device a well-defined level which is identical at absolute value in both cases. This defect is eliminated by operating, with the outputs of the bistable circuit described in FIG. 2, the switches $K_4$ and $K_5$ which connect the voltage sources $+V_M$ or $-V_M$ to the new output (point B) of the bistable circuit.

The complete circuit composed of the capacitors $C_1$ and $C_2$ constitutes an assembly for the integration of the calibrated output signal delivered by the bistable circuit at the point B. The voltage $+V_M$ or $-V_M$ induces within the capacitor $C_1$ charges $+\Delta Q$ or $-\Delta Q$ at each changeover to one of the two positions of equilibrium. These charges are stored in a capacitor $C_2$ of high value. The voltage developed across the terminals of said capacitor varies in steps. These steps are proportional to $V_M$ and to the ratio of the capacitors $C_1$ and $C_2$. In more precise terms, the voltage step $\Delta V$ is equal to $(\pm V_M) C_2/C_1$. This partiicular mode of integration is clearly not indispensable but has the advantage of being readily applicable in the monolithic technology. This type of integrating circuit constituted by the capacitors $C_1$ and $C_2$ is equivalent to a time constant which would have the value $C_2/C_1 f$ in which $f$ is the changeover frequency of the bistable circuit, thus resulting in the following cut-off frequency of the complete amplifier assembly:

$$F_c = \frac{C_1 f}{2\pi C_2}$$

The gain of the amplifier shown in FIG. 3 will now be determined, assuming that the bistable circuit is wholly symmetrical or in other words that the two amplifiers $A_1$ and $A_2$ are strictly identical and that the circuit is switched periodically and in alternate sequence to the position of equilibrium by inhibition (switch $K_3$) followed by a reversal of state under the influence of the input signal.

Transfer of charges from $C_1$ to $C_2$ takes place only after a change of state produced by the signal as a result of closure of the switch $K_6$. Let $e_n$ represent the noise voltage of both amplifiers brought back to a single input. Let $f(x)$ be the distribution of the noise which is assumed to be gaussian and uniform at the input. Let U be the differential input voltage. The output voltage observed will be the mean value of the voltages $\pm V_M$ weighted by their probabilities of presence. A positive signal will appear each time the voltage U is higher than the noise voltage. Let:

$$V_0 \int_{-\infty}^{U} f(x)dx$$

be this probability. We will have a negative signal when the noise is greater than the signal; let:

$$V_0 \int_{U}^{+\infty} f(x)dx$$

be the probability in this second case. The mean signal at the output of the device will be the difference:

$$V_s = V_M \left[ \int_{-\infty}^{U} f(x)dx - \int_{U}^{+\infty} f(x)dx \right]$$

if $F(x)$ is the primitive function of $f(x)$, we will have $V_s = V_M [2F(U)]$. The gain $dV_s/dU$ is given by $2V f(U)$, namely:

$$G(U) = \frac{2V_M}{\sigma\sqrt{2\pi}} e^{-\frac{x^2}{2\sigma^2}}$$

and for $X = O$, we have $$G = \frac{2V_M}{\sigma\sqrt{2\pi}}$$

Thus the gain depends only on the thermal noise at the input of the device. By way of example, for a value of $V_M$ of 10 volts an in a MOS transistor circuit in which $\sigma$ is of the order of 100 $\mu V$, the gain G has a value of 80,000. In the case of a bipolar transistor circuit in which $\sigma$ is of the order of 10 $\mu V$, the gain then has a value of 800,000.

The operation of the amplifier in accordance with the invention as described in the foregoing brings out the fact that the unstable circuit employed need not be a bistable circuit proper. Thus the two distinct positions of unstable equilibrium can have limited time-durations (this being the case of the multivibrator, for example); it is only necessary to ensure that control of the calibrating means (switches $K_4$ $K_5$) is carried out during this time interval (maintenance of the position of equilibrium produced by the application of the input signal). The invention clearly extends to amplifiers in which the unstable circuit is of this type.

Figure 4:
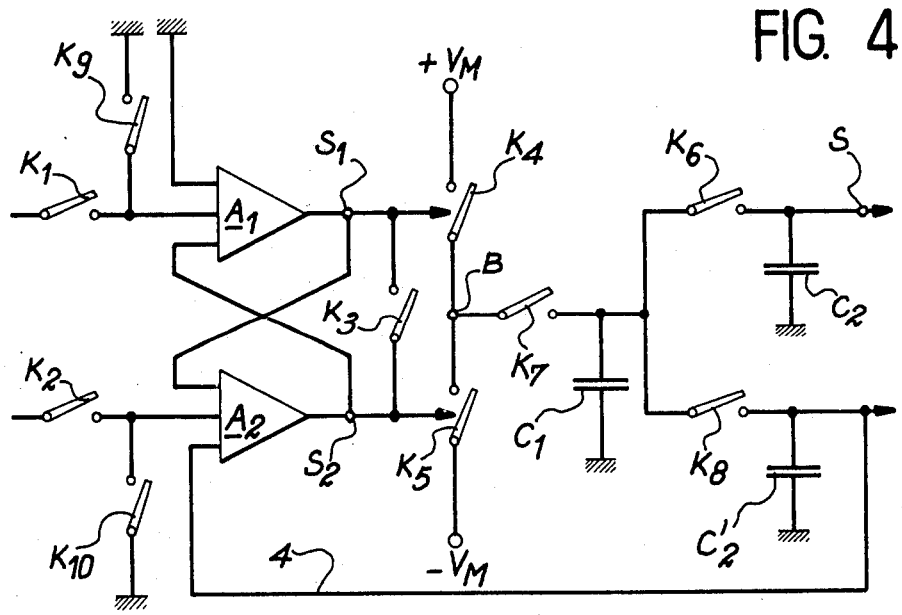
FIG. 4 is a wiring diagram of an amplifier comprising a compensating circuit for the offset voltage.

There is shown in FIG. 4 an alternative form of construction of the amplifier comprising a circuit for correcting the offset voltage of the amplifier. By offset voltage of a differential amplifier is meant the voltage to be applied to one of the amplifier inputs in order to obtain a zero voltaage at the output. The offset voltage is evidently zero in the case of an ideal amplifier. The amplifier proper is modified in order that it may be employed alternately either for amplifying the useful signal or for amplifying the offset voltage. During the automatic balancing period, the input of the signal is grounded and the output is connected to a second charge integrating system. Said second integrating system is connected as a feedback loop to the input of the amplifying circuit.

Each amplifier is thus provided with three inputs (which can have different sensitives), namely one input for the signal, one input for the feedback loop connection and one input for the correction of the offset voltage.

In order to obtain this result, the following modifications are made in the circuit shown in FIG. 3: a switch $K_7$ is inserted between the capacitor $C_1$ and the point B; a second integrating circuit constituted by the integrating capacitor $C'_2$ fitted with the switch $K_8$ is mounted in parallel with the capacitor $C_2$. The voltage appearing at the terminals of the capacitor $C'_2$ is fed back to the input of the amplifier $A_2$ via the lead 4. The input circuit of the amplifier is provided in addition to the switches $K_1$ and $K_2$ with the switches $K_9$ and $K_{10}$ which serve to connect the inputs of the amplifiers $A_1$ and $A_2$ to ground.

The operation of the device shown in FIG. 4 and described in the foregoing will now be described. The bistable circuit is blocked in the position of unstable equilibrium by the inhibition switch $K_3$ before any operation is performed. The switches $K_1$ and $K_2$ are open and the switches $K_9$ and $K_{10}$ are closed. The inputs of the amplifiers $A_1$ and $A_2$ are therefore grounded. The switch $K_3$ is opened. The bistable circuit changes over to a position of equilibrium under the influence of the offset voltage and of the noise. The switch $K_7$ is closed so as to take a charge $\Delta Q$ into the capacitor $C_1$, whereupon the switch $K_7$ is opened. The switch $K_8$ is closed. The charge $\Delta Q$ is then used to correct the voltage at the terminals of the capacitor $C'_2$ in order to render the bistable circuit symmetrical. This unbalance voltage is fed back to the input of the bistable circuit via the lead 4.

The switch $K_3$ is then again triggered into conduction. The signal is applied to the input of the bistable circuit by closing the switches $K_1$ and $K_2$ and by opening the switches $K_9$ and $K_{10}$. The inhibition switch $K_3$ is opened. The bistable circuit changes state under the influence of the signal applied to its input. The switch $K_7$ is closed in order to take a charge $\Delta Q$ into the capacitor $C_1$. The switch $K_7$ is then opened and the switch $K_6$ is triggered into conduction. The charge $\Delta Q$ then modifies the voltage at the terminals of the capacitor $C_2$.

At the end of a certain number of reversals of state, the offset voltage becomes very low.

In order to achieve the best possible compensation for the offset voltage, it is a desirable objective to give a high value to the capacitor $C'_2$.

It is self-evident that in a complete form of construction, provision would be made for a sequencing clock which delivers a pulse for initiating each cycle of operation of the amplifier and pulses displaced with respect to this initial pulse in order to initiate opening or closing of the switches $K_1$ and $K_2$, $K_9$ and $K_{10}$, $K_3$, $K_6$, $K_7$, $K_8$.

It is also readily apparent that the switches have been represented in the form of mechanical cut-off contacts solely in order to simplify the figure. In an integrated form of construction, these switches can advantageously be constituted by MOS transistors, the gate of which would represent the control input.

Figure 5:
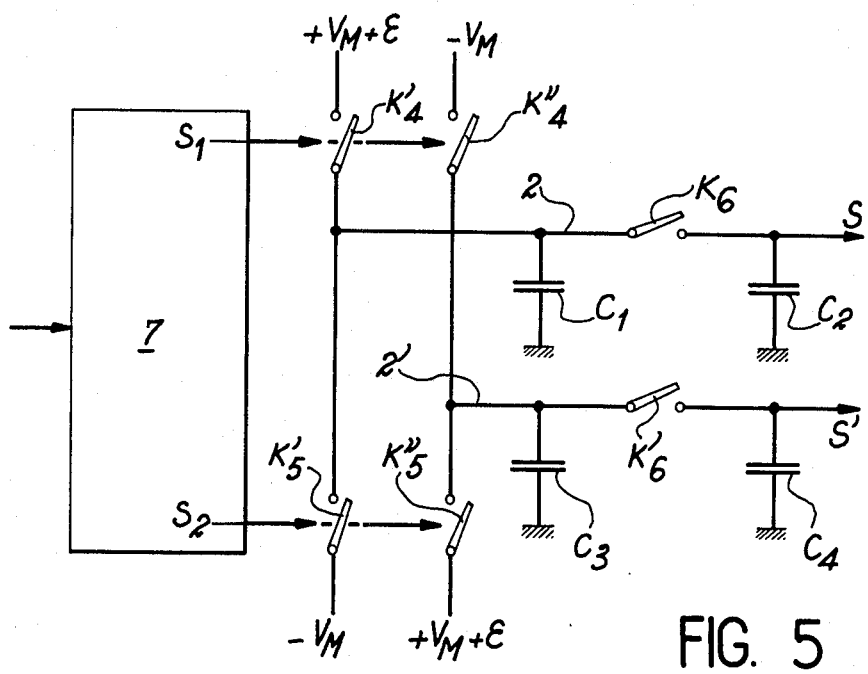
FIG. 5 shows an amplifier comprising an improved calibrating circuit for the output voltages.

A further improvement can be made in the basic circuit shown in FIG. 3 and relates to a particular mode of calibration of the signals delivered by the bistable circuit as shown in FIG. 5. This makes it possible to eliminate or at least to reduce the errors arising from lack of precision in the values of the voltages $V_m$ and $-V_m$ and also from the disturbances caused by the switches $K_4$ and $K_5$.

The bistable circuit is represented in the figure by the rectangle 7 with its outputs $S_1$ and $S_2$ corresponding to the two stable states. The signal emitted by the output $S_1$ operates on the one hand the switch $K'_4$ which is intended to connect the voltage source $+V_M$ to the common line 2 and on the other hand the switch $K''_4$ which is intended to connect the voltage source $-V_M$ to a second common line 2' whic performs the same function as the line 2 and is provided with capacitors $C_3$ and $C_4$ (these latter being identical with the capacitors $C_1$ and $C_2$) and with the switch $K'_6$. Similarly, the signal emitted by the output $S_2$ controls on the one hand the switch $K'_5$ which is intended to connect the voltage source $-V_M$ to the common line 2 and on the other hand the switch $K''_5$ which is intended to connect the voltage source $+V_M$ to the common line 2'. A differential output is obtained between the points S and S'.

It will be postulated that the positive voltage source does not have the exact value $+V_M$ but has the value $+V_M = \epsilon$, and that the system changes over to one side as often as it does to the other. The output S has the value $\epsilon/2$ and the output S' also has the value $\epsilon/2$, and the differential output is in fact zero. A similar reasoning would show that there is a compensation for the spurious pulses produced by the switches $K'_4$ and $K''_5$ if they are identical.

A third improvement concerns the input circuit of the bistable device and makes it possible to prevent saturation of the circuit in a common mode connection when the input voltages are of high value.

Figure 6:
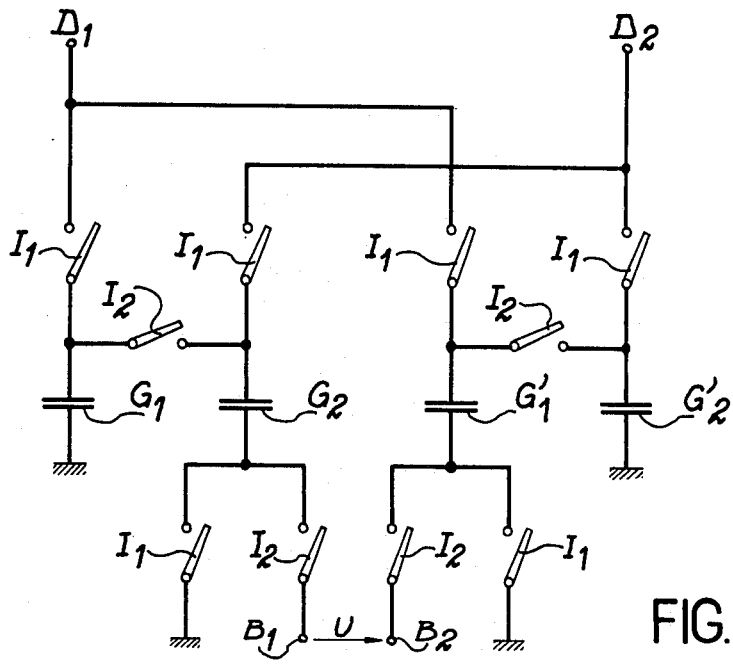
FIG. 6 shows one example of construction of an input circuit.

An input circuit of this type is shown in FIG. 6.

The input of the circuit is constituted by the terminals $D_1$ and $D_2$ and the input circuit is connected to the inputs of the bistable circuit proper through the terminals $B_1$ and $B_2$.

Said circuit comprises the parallel-connected capacitors $G_1$, $G_2$, $G'_1$, $G'_2$ which are connected to each other through the switches $I_1$ and $I_2$, all the switches $I_1$ being operated together. The same clearly applies to the switches $I_2$.

The input signals $E_1$ and $E_2$ are applied to the input terminals $D_1$ and $D_2$. The switches $I_1$ are closed and the switches $I_2$ are opened. The capacitors $G_1$ and $G'_1$ are charged to the voltage $E_1$ and the capacitors $G_2$ and $G'_2$ are charged to the voltage $E_2$. The switches $I_1$ are then opened and the switches $I_2$ are closed. The voltage $E_1-E_2$ is obtained at the terminal $B_1$ and the voltage $E_2-E_1$ is obtained at the terminal $B_2$. The voltage $U = 2(EE_1-E_2)$ is therefore present between $B_1$ and $B_2$ but the voltages $E_1-E_2$ and $E_2-E_1$ are alone present at each input of the bistable circuit, thus preventing any possible saturation of the unitary amplifiers which form part of said bistable circuit.

Figure 7:
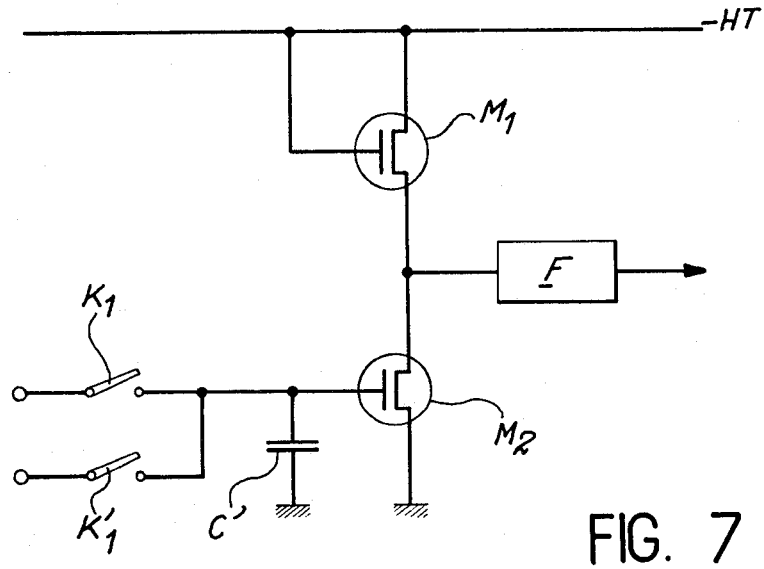
FIG. 7 shows one embodiment of the input circuit.

FIG. 7 shows an example of construction of one of the amplifiers $A_1$ or $A_2$ and of its input circuit. The amplifier is constituted by two MOS transistors $M_1$ and $M_2$, the transistor $M_2$ being such as to have a high input capacitance $C'$. The input signal is applied to the transistor $M_2$ via the switch $K_1$ and the feedback connection signal derived from the output of the amplifier $A_2$ is applied to said transistor via the switch $K'_1$. The signal is applied (via the switch $K_1$) so as to charge the input capacitors in a first step. The circuit is then closed (through the switch $K'_1$) and changes state as a function of the initial charges introduced. In order to minimize the influence of noise on the change of state, a filter F is placed at the output.

Figure 8:
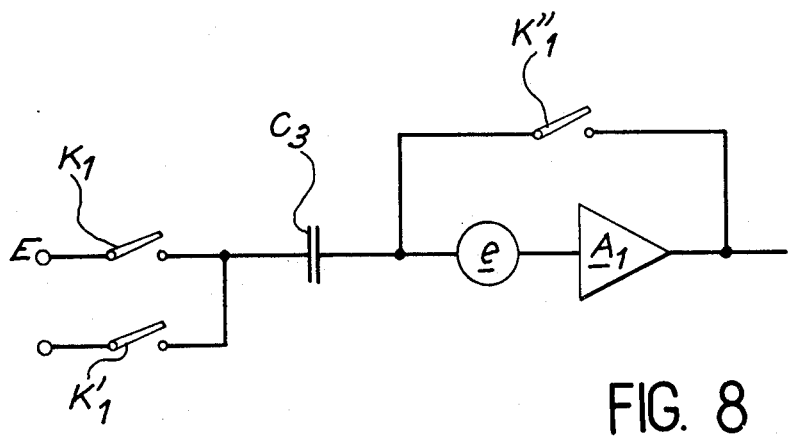
FIG. 8 is a schematic diagram which illustrates one means for compensating the offset voltage.

FIG. 8 illustrates the case in which a connecting capacitor $C_3$ is employed between the input of the amplifying circuit and the input of each of the amplifiers $A_1$ and $A_2$. Postulating that $e$ is the offset voltage of the stage, the output of the amplifier $A_1$ is fed back to its input via the switch $K''_1$.

The advantage of this circuit arrangement is as follows. The capacitor $C_3$ is pre-charged by closing the switches $K_1$ and $K''_1$. The capacitor $C_3$ is charged to the voltage $$\frac{e}{1+\frac{1}{A}} S,$$

if S is the output voltage. By opening the switches $K_1$ and $K''_1$, there is thus provided a stage with a connecting capacitor $C_3$ charged to the voltage S. The offset voltage of the stage which was initially $e$ becomes $$e' = 2 - \frac{e}{1+\frac{1}{A}} = \frac{e}{1+A},$$

thus clearly reducing the offset voltage of the stage to a considerable extent (factor $1 + A$).

Figure 9:
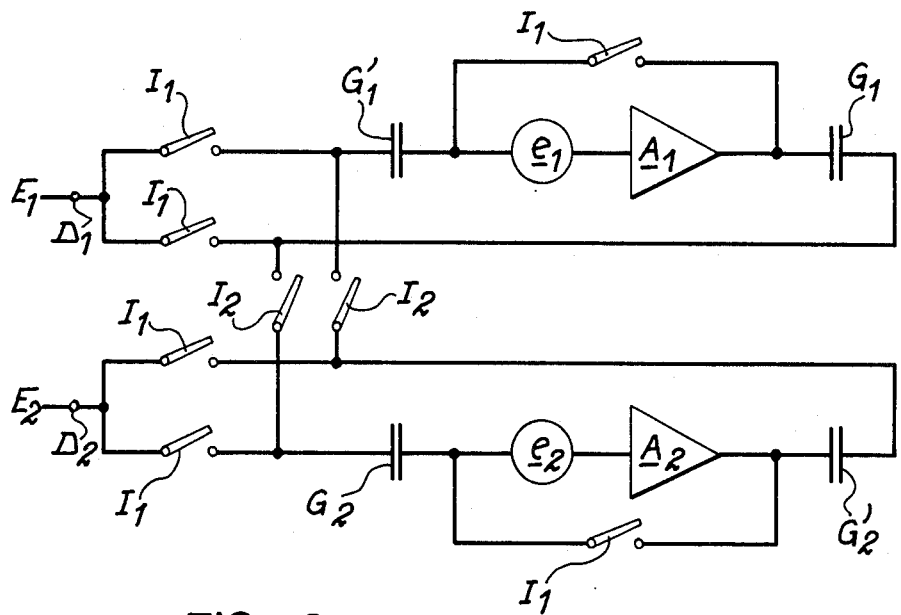
FIGS. 9 and 10 show modes of compensation for the offset voltage in accordance with the principle shown in FIG. 8.

FIG. 9 shows a form of construction which makes it possible both to reduce the common mode voltage and the offset voltage. As can readily be seen, this form of construction combines the input circuit shown in FIG. 6 with that shown in FIG. 8.

The same notations as in FIG. 6 have again been adopted. It is observed that the ground is replaced respectively by the output voltage $S_1$ of the amplifier $A_1$ and by the output voltage $S_2$ of the amplifier $A_2$.

If the switches $I_1$ are closed and the switches $I_2$ are open, the capacitors $G_1$, $G_2$, $G'_1$ and $G'_2$ are charged to the following values:
in the case of $G'_1$ $$-E_1 + \frac{e_1}{1 + \frac{1}{A}},$$

in the case of $G_1$ $$E_1 - \frac{e_2}{1 + \frac{1}{A}};$$

in the case of $G_2$ $$\frac{e_2}{1 + \frac{1}{A}} - E_2;$$

and in the case of $G'_2$ $$E_2 - \frac{e_2}{1 + \frac{1}{A}}.$$

After opening of the switches $I_1$, there are obtained two amplifiers ($G_1$, $G'_1$, $A_1$) and ($G_2$, $G'_2$, $A_2$) which have a zero natural offset voltage if no account is taken of the interferences produced by the switches.

In fact, assuming that $E_1$ is zero, the capacitor $G_1$ which is charged to $$-\frac{e_1}{1 + \frac{1}{A}}$$

produces at the input of the amplifier $A_1$ the voltage $$+\frac{e_1}{1 + A}$$

($A_1$ has a gain of $-A$). This voltage is added to the voltage at the terminals of the capacitor $G'_1$ which has the value $$-e_1 + \frac{e_1}{1 + \frac{1}{A}}.$$

The sum of these voltages in fact gives a zero voltage.

Figure 10:
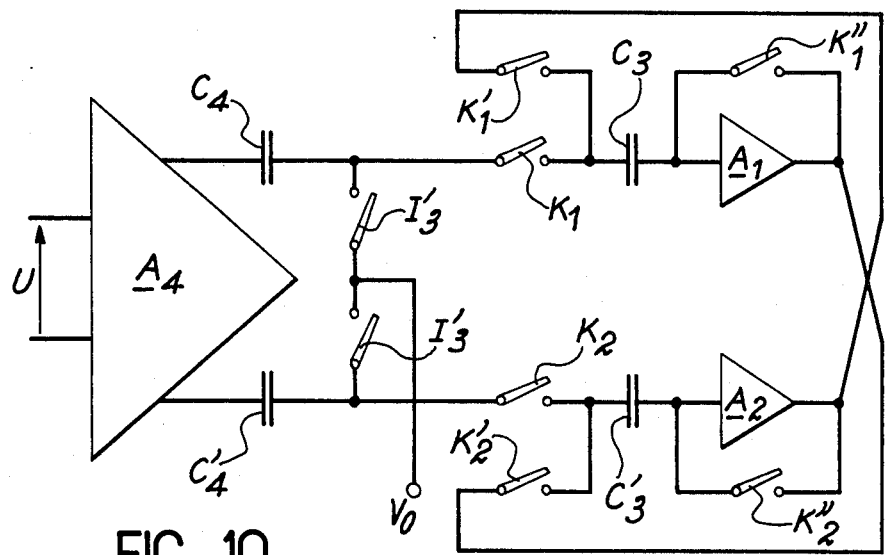

FIG. 10 shows an alternative form of construction in which the common mode voltage is reduced by means of a differential input. The input comprises an amplifier $A_4$ connected as a differential amplifier and two capacitors $C_4$ and $C'_4$ for storing in memory the common mode voltage resulting from the previous stages including $A_4$. The circuit shown in the figure is associated with the amplifiers $A_1$ and $A_2$; the indices 1 correspond to the amplifier $A_1$ and the indices 2 correspond to the amplifier $A_2$. The switches $I_3$ make it possible to apply a bias voltage $V_0$ which serves to adjust the common mode voltage applied to the amplifiers $A_1$ and $A_2$ at the time of a change of state.

If the switches $I'_3$, $K_1$, $K''_1$, $K_2$ and $K''_2$ are closed, the capacitors $C_4$, $C'_4$, $C_3$ and $C'_3$ are charged. If the input U is zero, the capacitors $C_4$ $C'_4$ compensate for the common mode resulting from the previous stages and the capacitors $C_3$ and $C'_3$ partly compensate for the offset voltage as already explained in connection with FIG. 8.

Figure 11:
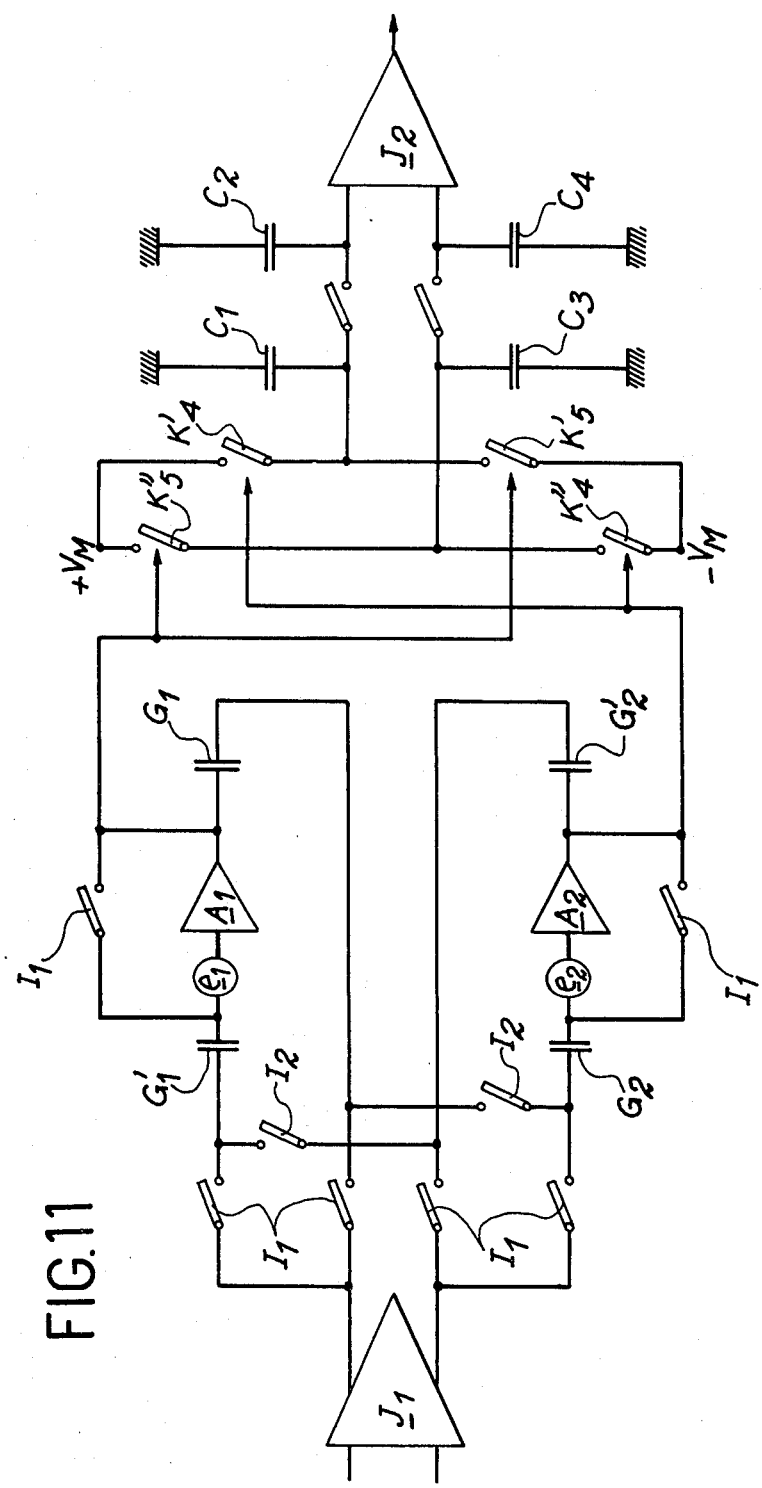
FIGS. 11 and 12 are two alternative forms of construction of the offset compensation amplifier.

FIG. 11 shows a second form of construction of the complete amplifier assembly. In this form of construction, the calibrating mode illustrated in FIG. 5 is combined with the amplifying stage proper as illustrated in FIG. 9.

The amplifier comprises an input stage $J_1$ and an amplifying assembly which is identical with the assembly shown in FIG. 9; the calibrating stage of FIG. 5 essentially comprises the voltage sources $+V_m$ and $-V_m$ and the double integration circuit, and an output matching circuit $J_2$.

Figure 12:
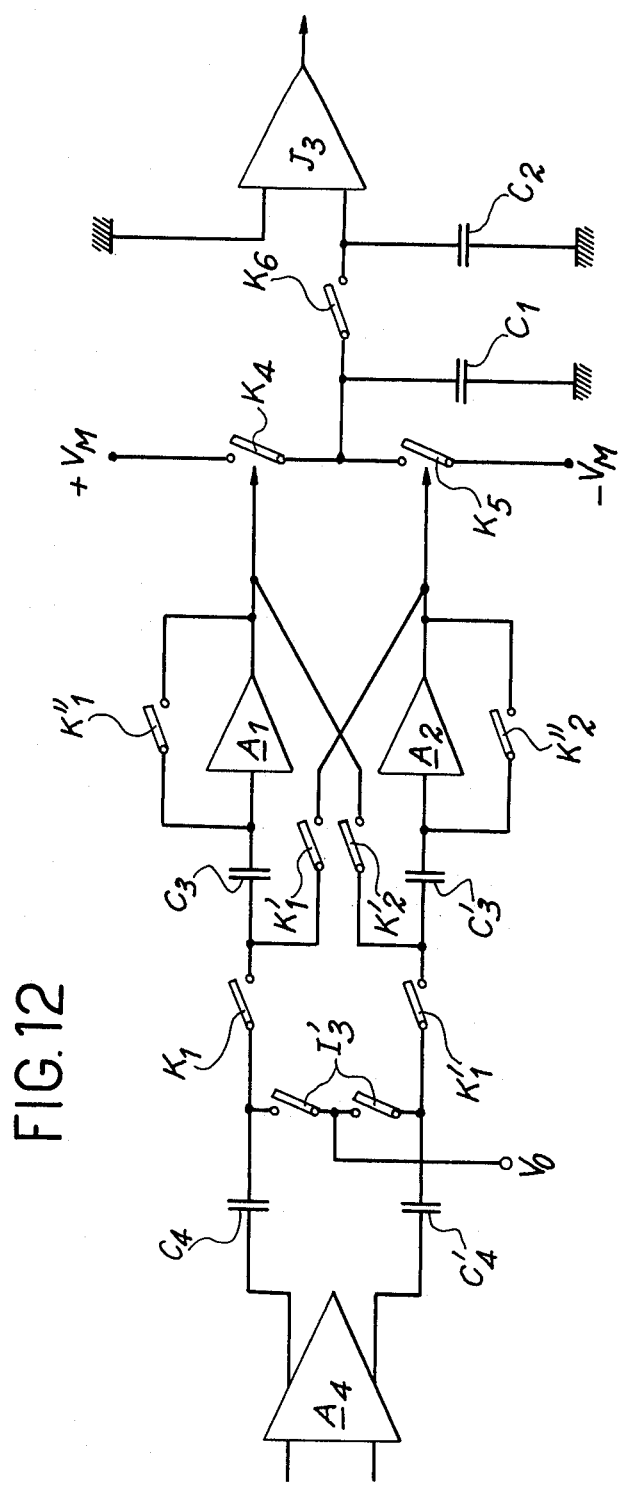

FIG. 12 illustrates a third form of construction of the amplifier in which a simple calibrating and integrating circuit and an output matching circuit $J_3$ is combined with the circuit shown in FIG. 10.

It is worthy of note that the diagrams of FIGS. 8, 9, 10, 11 and 12 which comprise connecting capacitors and are of the alternating-current amplifier type employ a basic circuit which is no longer a bistable device but a multivibrator: this is not objectionable if, as explained earlier, the calibrating means are caused to operate before the multivibrator changes state of its own accord.

Figure 13A:
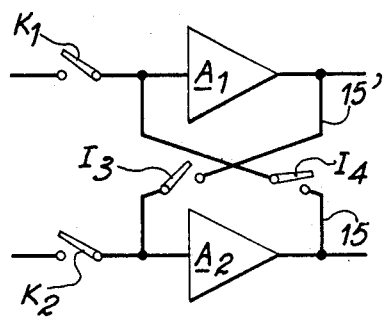
FIGS. 13a, 13b and 13c show alternative forms of construction of the inhibition control device.
Figure 13B:
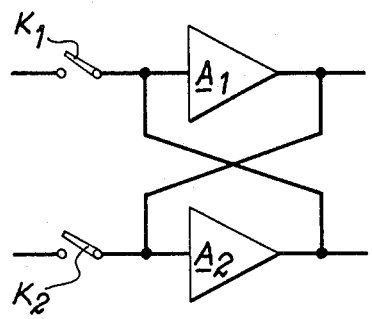
Figure 13C:
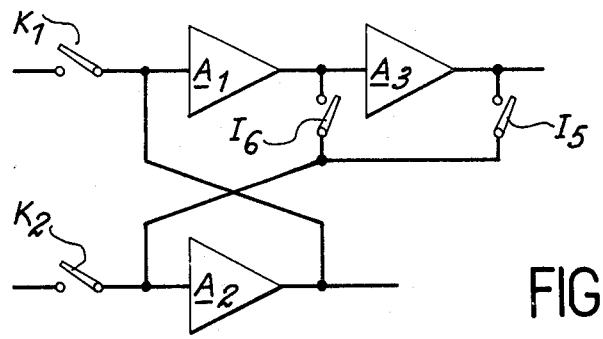

FIGS. 13a, 13b and 13c show forms of construction of the inhibition circuit other than the use of the switch $K_3$.

In the example illustrated in FIG. 13a, a switch ($I_3$ and $I_4$ respectively) is placed in each feedback lead 15 and 15' of the amplifiers $A_1$ and $A_2$ which constitute the bistable device. Thus the circuit can no longer change state; it is unnecessary to maintain it in the position of unstable equilibrium and the inputs are at high impedance. This is the mode of inhibition employed in the diagrams of FIGS. 7, 8, 9, 10, 11 and 12.

In the example shown in FIG. 13b, provision is made only for the switches $K_1$ and $K_2$ but a low-impedance voltage source is employed for introducing the signal and replaces the inhibition circuit. In fact, when $K_1$ and $K_2$ are closed, this is tantamount to short-circuiting the inputs and outputs of the amplifiers $A_1$ and $A_2$. When $K_1$ and $K_2$ are opened, the bistable circuit changes over to that side of the input which has the highest level.

In the last example shown in FIG. 13c, the output of the amplifier $A_1$ drives an amplifier $A_3$ having a gain of $-1$, the output of which is connected to the input of the amplifier $A_2$ through the switch $I_5$; the output of the amplifier $A_1$ can be connected directly to the input of the amplifier $A_2$ through the switch $I_6$.

The present invention is also concerned with the application of said amplifier to the construction of an analog-to-digital converter.

Figure 14:
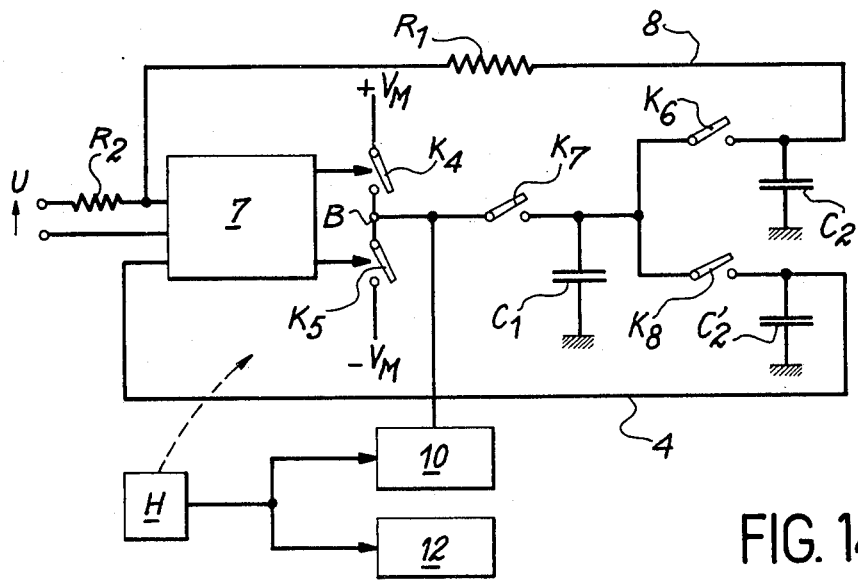
FIG. 14 shows one form of construction of an analog-to-digital converter which makes use of the amplifier in accordance with the invention.

In the example of FIG. 14, a converter of this type is constructed from the offset voltage compensation amplifier of FIG. 4. The bistable unit which is again shown in this example is represented in a simplified manner by the rectangle 7, the calibration voltages $+V_M$ and $-V_M$, and the two integration units which are essentially constituted by the capacitors $C_2$ and $C'_2$, the signal delivered by the capacitor $C'_2$ being fed back to the correction input of the bistable device 7. The converter comprises in addition the loop circuit 8 for feeding the output of the amplifier back to the "signal" input of the bistable device which is essentially constituted by the resistors $R_1$ and $R_2$. The converter further comprises a bidirectional counter 10 incremented by the signals delivered by the sequencing clock H of the amplifier. Each clock pulse corresponds to the beginning of each cycle of operation of the amplifier described with reference to FIG. 4. Up/down counting by the bidirectional counter 10 is controlled by the logical signal $+V_M$ or $-V_M$ which is delivered at the amplifier output B, the signal $+V_M$ being intended to initiate the counting-up and the signal $-V_M$ being intended to initiate counting-down. The clock signal also increments a second counter 12.

The operation of the converter is as follows. The feedback loop 8 of the amplifier permits the achievement of a substantially linear gain. Once the output voltage $V_S$ has attained its equilibrium value, the positive and negative charges are balanced and we have the relation:

$$\Sigma(+V_M-V_S) C_1 + \Sigma(-V_M-V_S) C_1 = 0$$

whence, if $\overline{V_S}$ designates the mean value of $V_S$:

$$\overline{V_S} = (\Sigma+V_M) - (\Sigma-V_M)/N,$$

where $N$ represents the total number of pulses of the clock signal.

If the number of positive pulses is $N_1$ $(+V_M)$, and the number of negative pulses is $N_2$ $(-V_M)$ we have:

$$\overline{V_S} = N_1 - N_2/N_1 + N_2 \, V_M$$

The numerator of the fraction is determined by the bidirectional counter 12 and its denominator is determined by the counter 14.

The circuit of FIG. 4 can be slightly transformed in order to obtain a voltage comparator with compensation for the offset voltage. It is only necessary to suppress the branch comprising the capacitor $C_2$ and the switch $K_6$. The two logical outputs of the comparator are the outputs of the amplifiers $A_1$ and $A_2$. It is also possible to employ as output the point B which delivers the voltage $+V_M$ or $-V_M$ according to the relative values of the voltages applied to the two inputs of the bistable circuit. Compensation for the offset voltage is always achieved by means of a feedback loop connection from the output of the integrating circuit to the input of the amplifier $A_2$.

What I claim is:
1. A voltage amplifier essentially comprising:
   an unstable circuit having one position of unstable equilibrium and two distinct positions of equilibrium which can be maintained for a certain period of time, each of said distinct positions of equilibrium corresponding to an input signal polarity,
   an input stage for applying signals to the input of said unstable circuit for a given period of time,
   said unstable circuit switching from said unstable state of equilibrium to the distinct position of equilibrium corresponding to the sign of the signal applied to the input of said unstable circuit in response to the amplitude of the signal applied to said input being greater than the noise signal at said input,
   means for returning said unstable circuit to its position of unstable equilibrium,
   means for calibrating the output of said unstable circuit at the voltage $+V_m$ or at the voltage $-V_m$ according to which of said distinct positions of equilibrium said unstable circuit switches,
   and means for integrating the calibrated signal which appears at the output of said bistable circuit for a given period of time.

2. An amplifier according to claim 1, wherein said unstable circuit is a bistable circuit and said distinct positions of equilibrium are positions of stable equilibrium.

3. An amplifier according to claim 1, wherein said unstable circuit comprises two outputs provided with means for calibrating one of the outputs at the voltage $+V_m$ and the other output at the voltage $-V_m$.

4. An amplifier according to claim 1, wherein the unstable circuit is constituted by two amplifiers mounted with negative feedback to each other.

5. An amplifier according to claim 4, wherein the calibrating means are constituted by a voltage source $+V_m$ and wherein the integrating means comprise first and second separate integrating circuits, the voltage $+V_m$ and the voltage $-V_m$ being connected to said first integrating circuits by means of a first pair of switches, respectively, the voltage $+V_m$ and the voltage $-V_m$ being connected to said second integrating circuit by a second pair of switches, respectively, the switches of the same pair being controlled by different states of the unstable circuit and a given state of said unstable circuit controlling two switches one in each said pair and associated with sources of voltage $V_m$ of different signs.

6. An amplifier according to claim 4, wherein the input stage comprises in the case of each input of the unstable circuit a switch and a capacitor mounted in series and wherein the output of each of said amplifiers constituting said unstable circuit is fed back to the input of the other amplifier by means of a switch and wherein each amplifier comprises a loop circuit providing feedback from its output to its input by means of a switch.

7. An amplifier according to claim 4 wherein each input of the bistable circuit is connected on the one hand to the input of the corresponding amplifier constituting said bistable circuit by means of a first switch and a first coupling capacitor and on the other hand to the output of said amplifier by means of a second switch and a second coupling capacitor and wherein each amplifier constituting said bistable circuit comprises a loop circuit providing direct feedback from its output to its input by means of a switch, and wherein the input of each first coupling capacitor associated with one amplifier is connected by means of a switch to the output of the second coupling capacitor associated with the other amplifier.

8. An amplifier according to claim 1, wherein the calibrating means are constituted by two voltage sources $+V_M$ and $-V_M$ respectively, said voltage sources being each connected to a common output lead through a switch controlled by the corresponding state of the unstable circuit.

9. An amplifier according to any one of claim 1, wherein the integrating means are constituted by two capacitors mounted in parallel between said common output lead and ground, said common lead being provided with a switch placed between the points of connection of said capacitors to said line.

10. An amplifier according to claim 1, wherein said amplifier comprises one connection to ground through a switch in the case of each input and wherein said amplifier comprises a second assembly of integrating means mounted in parallel with the first means and having an output connected in a feedback loop to one of the two inputs of the bistable circuit.

11. The application of the amplifier according to claim 10 to the construction of an analog-to-digital converter, wherein the first integrating means are connected in a feedback loop to the other input of the bistable circuit and wherein a synchronization clock increments a first bidirectional counter in which the direction of counting is controlled by the sign of the calibrated signal delivered by said bistable circuit and increments a second counter in one direction.

12. The application of the amplifier according to claim 10 to the construction of a voltage comparator which provides compensation for offset voltage, wherein the two voltages to be compared are applied to the two inputs of said amplifier and wherein the logical comparison output is collected at the output of the bistable circuit.

* * * * *